(12) United States Patent
Sercu (10) Patent No.: US 8,959,009 B1
(45) Date of Patent: Feb. 17, 2015

(54) MODELING DIELECTRIC COATING OF CONDUCTOR

(75) Inventor: Jeannick Sercu, Ghent (BE)

(73) Assignee: Keysight Technologies, Inc., Santa Rosa, CA (US)

(*) Notice: Subject to any disclaimer, the term of this patent is extended or adjusted under 35 U.S.C. 154(b) by 642 days.

(21) Appl. No.: 13/171,825

(22) Filed: Jun. 29, 2011

(51) Int. Cl.
*G06F 17/50* (2006.01)

(52) U.S. Cl.
USPC ............................................. 703/14; 703/13

(58) Field of Classification Search
None
See application file for complete search history.

(56) References Cited

U.S. PATENT DOCUMENTS

| | | | |
|---|---|---|---|
| 7,331,023 B2* | 2/2008 | Sercu et al. | 716/136 |
| 7,772,868 B2* | 8/2010 | Doong et al. | 324/762.03 |
| 8,146,032 B2* | 3/2012 | Chen et al. | 716/106 |
| 8,164,113 B2* | 4/2012 | Lin et al. | 257/173 |
| 8,352,232 B2* | 1/2013 | Han et al. | 703/14 |
| 8,552,563 B2* | 10/2013 | Law et al. | 257/774 |
| 8,618,629 B2* | 12/2013 | Kim et al. | 257/531 |
| 2002/0133324 A1* | 9/2002 | Weaver et al. | 703/14 |

OTHER PUBLICATIONS

Liu et al., "Compact Wideband Equivalent-Circuit Model for Electrical Modeling of Through-Silicon Via", IEEE Transactions on Microwave Theory and Techniques, vol. 59, Issue 6, Jun. 2011, pp. 1454-1460.*

Han, "Electromagnetic Modeling of Interconnections in Three-Dimensional Integration", Doctoral dissertation, Georgia Institute of Technology, 2009, 167 pages.*

Katti et al., "Electrical Modeling and Characterization of Through Silicon Via for Three-Dimensional ICs", IEEE Transactions on Electron Devices, vol. 57, No. 1, Jan. 2010, pp. 256-262.*

S.M. Sze, "Physics of Semiconductor Devices", John Wiley & Sons (2nd ed.), ISBN 0-471-05661-8, p. 368-371 (1981).

S. K. Lim, "TSV-Aware 3D Physical Design Tool Needs for Faster Mainstream Acceptance of 3D ICs", DAC.com knowledge center article, www.dac.com, 2010, pp. 1-11.

"3D Silicon-to-Silicon Stack Solutions for Your Next SoC", Industry Panel discussion, LSI Technology Showcase, Oct. 6, 2010, pp. 1-40.

P. Dorsey, "Xilinx Stacked Silicon Interconnect Technology Delivers Breakthrough FPGA Capacity, Bandwidth and Power Efficiency", Xilinx white paper, Oct. 27, 2010, pp. 1-10.

Uksong Kang et al., "8Gb 3D DDR3 DRAM using through-silicon-via technology", IEEE International Solid-State Circuits Conference—Digest of Technical Papers, 2009, Publication Date Feb. 10, 2009 , pp. 130-131,131a.

(Continued)

*Primary Examiner* — Omar Fernandez Rivas
*Assistant Examiner* — Herng-Der Day (57) ABSTRACT

A method for modeling a conductor in a substrate and a dielectric coating formed between the conductor and the substrate includes meshing a surface of the conductor into multiple conductor cells, each cell including a corresponding node in network topology, modeling a first displacement current flowing from each cell through the substrate, and modeling a second displacement current flowing from each cell through the dielectric coating. Modeling the first displacement current includes determining a first branch connecting the node corresponding to each conductor cell to ground, the first branch having at least a first capacitance. Modeling the second displacement current includes determining a coating capacitance connected in series between the node corresponding to each conductor cell and the first branch, the coating capacitance representing a capacitive effect of the dielectric layer.

18 Claims, 4 Drawing Sheets

(56) References Cited

OTHER PUBLICATIONS

L. Cadix et al., "RF Characterization and Modeling of High Density Through Silicon Vias for 3D Chip Stacking", ST Microelectronics, Journal for Microelectronic Engineering, vol. 87, 2010, pp. 491-495.

V. Gerousis, "Cadence Design System—Design Challenges of Stacked Chip Using TSV (Thru Silicon Via)", SEMATECH Design and Test Challenges for 3D ICs, San Jose, Nov. 13, 2008, pp. 1-11.

D. Petranovic, "TSV based 3D integration: Mentor's Verification Solution and Requirements for Standards", Si2-GSA Workshop, Sep. 2009, pp. 1-8.

Soon Wee Ho et al., "High RF performance TSV silicon carrier for high frequency application", Electronic Components and Technology Conference, Publication Date: May 30, 2008, pp. 1946-1952.

M. Swaminathan et al., "3D Modeling of Thru Silicon Vias (TSVs), a Key Enabling Technology for 3D Integration", Interconnect and Packaging Center, Georgia Institute of Technology, Mar. 27, 2009, pp. 1-37.

Ki Jin Han, "Polarization mode basis functions for modeling insulator-coated through-silicon via (TSV) interconnections", IEEE Workshop on Signal Propagation on Interconnects, Publication Year: 2009, pp. 1-4.

\* cited by examiner

MODELING DIELECTRIC COATING OF CONDUCTOR

BACKGROUND

Conventional general purpose three-dimensional (3D) electromagnetic modeling (EM) simulators that incorporate volume discretization techniques, such as the finite elements method (FEM) or the finite-difference time domain (FDTD) method, are suffering from the excessive computer processing and storage capacity that is needed for adequately modeling conductor structures coated with thin layers of dielectric material, referred to as dielectric coatings. The number of mesh elements to be included in the modeling process is prohibitively large due to large aspect ratio differences of thin dielectric coating layers in combination with large 3D conducting objects. Therefore, general purpose 3D EM simulators can only be applied for structures with limited geometrical complexity.

Similarly, 3D EM simulators that use surface discretization techniques, such as the boundary element method (BEM), have essentially the same problem. Such 3D EM simulators introduce equivalent electric and magnetic surface currents at boundaries of the dielectric coating and conductive objects. Incorporating the effects of the dielectric coating dramatically increases the size of the discretized problem to be solved, again exceeding processing and storage capacity.

One class of 3D EM simulators, referred to as 3D planar EM simulators, takes advantage of the Green's function technology to incorporate the effects of a dielectric layer stack (also known as the substrate) in the simulation without additional discretization cost for the dielectric layers. The 3D planar simulators deploy integral equations and conductor surface meshing techniques to model the electromagnetic effects of 3D finite conductors embedded in the dielectric layers. However, the Green's function technology only supports dielectric layers that are planar and extend to infinity, and therefore cannot handle finite 3D dielectric layers and coatings in the solution process.

Other conventional 3D EM simulators provide application focused solutions. For example, one conventional through-silicon via (TSV) modeling approach is based on integral equations derived from Maxwell's equations in combination with circuit theory to combine a series RL-model for the conductor current and a parallel GC-model for the substrate current with an excess capacitance for the polarization currents in the TSV liner dielectric in an equivalent RL-GC network for the TSV structure. The TSV liner dielectric can be viewed as a coating of the TSV conductor. An example of the TSV modeling approach is described by Swaminathan et al., "3D Modeling of Through-Silicon Vias (TSVs), a Key Enabling Technology for 3D Integration," *Interconnect and Packaging Center*, Georgia Institute of Technology (Mar. 27, 2009), and K. J. Han et al., "Electromagnetic Modeling of Through-Silicon Via (TSV) Interconnections Using Cylindrical Modal Basis Functions," *IEEE Trans. Advanced Packaging*, vol. 33, no. 4, pp. 804-817, November 2010. The TSV modeling approach deploys global cylindrical basis functions instead of meshing to provide rapid modeling (fewer unknowns) for the TSV structures. The use of global basis functions reduces computational cost and model complexity and enables the simulation of large arrays of TSVs. However, the TSV modeling approach embeds the geometry specifics of TSV structures and therefore lacks flexibility to be applicable to more general structures. Technologies based on meshing are more flexible in dealing with general geometries.

Further, conventional solutions do not account for the voltage dependent metal-oxide-semiconductor (MOS) effect that takes place at the silicon contact surface, where the metal is the TSV conductor, the oxide is the dielectric coating, and the semiconductor is silicon. The MOS structure introduces an effect of accumulation, depletion and inversion of the major carriers in the silicon that depend on substrate doping and TSV bulk voltage. The voltage dependent depletion layer in the silicon bulk changes the TSV isolation. This effect is also included in the modeling process.

SUMMARY

In a representative embodiment, a method is provided for modeling a conductor in a substrate and a dielectric coating formed between the conductor and the substrate. The method includes meshing a surface of the conductor into multiple conductor cells, each conductor cell including a corresponding node in network topology; modeling a first displacement current flowing from each conductor cell through the substrate; and modeling a second displacement current flowing from each conductor cell through the dielectric coating. Modeling the first displacement current includes determining a first branch connecting the node corresponding to each conductor cell to ground, the first branch having at least a first capacitance. Modeling the second displacement current includes determining a coating capacitance connected in series between the node corresponding to each conductor cell and the first branch, the coating capacitance representing a capacitive effect of the dielectric layer.

In another representative embodiment, a device is provided for modeling a semiconductor circuit, including a semiconductor substrate, a dielectric layer and a conductor embedded in the dielectric layer. The device includes a planar electromagnetic modeling (EM) simulator configured to model electromagnetic effects of the conductor automatically. The modeling includes meshing a surface of the conductor into conductor cells; modeling a first displacement current flowing from each conductor cell through the substrate, including determining a first branch connecting a node corresponding to each conductor cell to ground; and modeling a second displacement current flowing from each conductor cell through the dielectric layer, including determining a capacitance connected in series between the node corresponding to each conductor cell and the first branch. The capacitance represents a capacitive effect of the dielectric layer. The device may further include a DC circuit simulator configured to determine a plurality of DC voltages in the semiconductor circuit.

In another representative embodiment, a computer readable medium is provided for storing a program, executable by a computer system, for modeling a conductor in a substrate and a dielectric coating formed between the conductor and the substrate. The computer readable medium includes a meshing code segment for meshing a surface of the conductor into multiple conductor cells, each conductor cell including a corresponding node in network topology; a first modeling code segment for modeling a first displacement current flowing from each conductor cell through the substrate; a second modeling code segment for modeling a second displacement current flowing from each conductor cell through the dielectric coating; and a third modeling code segment for modeling a conductive current flowing through each cell. Modeling the first displacement current includes determining a first branch connecting the node corresponding to each conductor cell to ground, the first branch having at least a first capacitance. Modeling the second displacement current includes determining a coating capacitance connected in series between the node corresponding to each conductor cell and the first branch, the coating capacitance representing a capacitive effect of the dielectric layer. Modeling the conductive current includes connecting the node corresponding to each cell to another node corresponding to another cell through a resistive/inductive branch.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Various representative embodiments provide a 3D EM simulator, e.g., implemented using software algorithms executable by a computer processor, for modeling a conductor in a substrate and a dielectric coating formed between the conductor and the substrate. For example, the conductor may be a conductive interconnection, such as a through-silicon via (TSV), between layers of a semiconductor device, and the substrate may be the semiconductor material, for example. However, the modeling may apply to any conductor separated from a substrate by a dielectric coating, such as electrodes, coated capacitor plates, and the like.

Generally, dielectric coating technology includes depositing a thin layer of dielectric material at the surface of a conductor to realize a certain electronic isolation function. Practical applications of dielectric coating technology include, for example, electronic design of interconnection traces for radio frequency (RF) boards and RF integrated circuits (RFIC) (e.g., passivation layers are added as dielectric coatings), metal-insulator-metal (MIM) capacitors (e.g., capacitor dielectric acts as dielectric coating between capacitor plates), and TSVs (e.g., silicon oxide added as dielectric coating to provide isolation from silicon bulk). A TSV, in particular, is a cylindrical conductive (e.g., metallic) interconnection that passes through a silicon substrate in order to provide an electrical interconnection path for signals, clocks and/or power.

Figure 1:
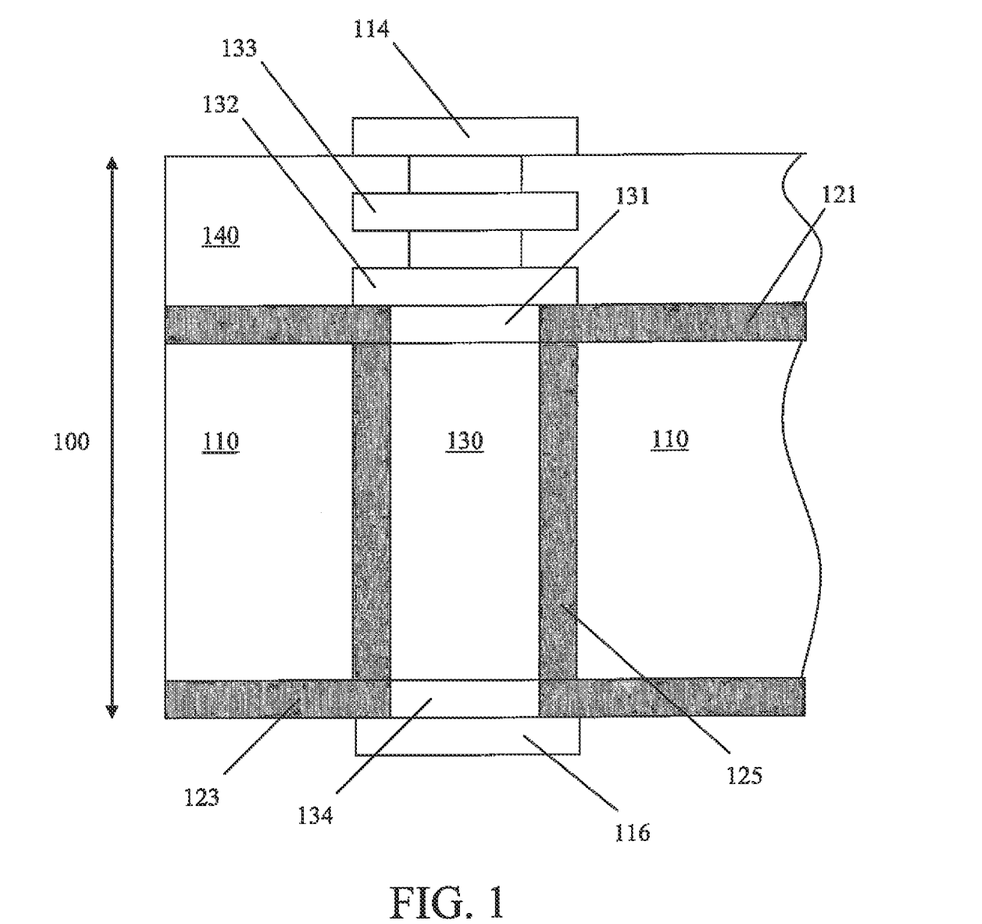
FIG. 1 is a block diagram showing an example of a die having a through-silicon via (TSV).

FIG. 1 is a block diagram showing an example of a die having a TSV. In the depicted configuration, die 100 includes substrate 110 with representative TSV 130 passing through the substrate 110. The substrate 110 may be formed of silicon, for example, although other materials compatible with semiconductor processes may be incorporated, such as silicon oxide (SiO), silicon nitride (SiN), germanium (Ge) or gallium arsenide (GaAs). Top isolation layer 121 and top metal layer 131 are formed on top surfaces of the substrate 110 and the TSV 130, and insulating layer 140 is stacked on the top isolation layer 121. Metal layers 132 and 133 are buried in the insulating 140. Bond pad 114 is formed on the top surface of the insulating layer 140, and is electrically connected to the TSV 130 via the interconnected metal layers 131-133. Bottom isolation layer 123 and bottom metal layer 134 are formed on bottom surfaces of the substrate 110 and the TSV 130. Landing pad 116 is formed on bottom surfaces of the bottom isolation layer 123 and the bottom metal layer 134, and is electrically connected to the TSV 130 via the bottom metal layer 134.

The TSV 130 is a conductive interconnection between the bond pad 114 on the top surface (frontside) of the die 100 and the landing pad 116 on the bottom surface (backside) of the die 100. The TSV 130 is separated from the substrate 110 by a TSV liner, which is a thin layer of dielectric material or dielectric coating 125, and provides electrical isolation between the conductive material of the TSV 130 and the substrate 110. The dielectric material of the dielectric coating 125 may be silicon dioxide, for example, and the conductive material of the TSV 130 may be polysilicon, copper or tungsten, for example, although other materials may be incorporated in various configurations. Also, the dielectric coating 125 may be formed of the same or different material than the top isolation layer 121 and/or the bottom isolation layer 123.

TSV technology, as shown in FIG. 1, for example, is integral to building 3D chip structures. For example, higher integration densities of 3D chip structures are achieved by stacking dies, such as die 100, on top of one another. Therefore, the TSV connections, such as TSV 130, provide orders of magnitude shorter electrical connections leading to significant space savings, lower manufacturing costs and lower power consumption. However, electronic system design and associated modeling techniques become increasingly complicated to handle multi-die and package design and analysis in an integrated design environment.

In order to provide accurate models of TSV connections in electrical design and verification flows, 3D EM simulation and modeling tools are needed. Unwanted coupling among a large number of vias and signal leakage in the substrate bulk may significantly reduce the integrity of signals that run through the TSV connections. Thus, the 3D EM simulation tools should fully capture the coupling effects and generate physical TSV-aware S-parameter models, in order to provide designers with compact, high frequency models for evaluating the impact of TSVs on system performance.

As mentioned above, some 3D planar EM simulators rely on the Green's function technology and conductor surface meshing, but do not include effects of finite dielectric coatings of TSV connections (or other conductors separated from the substrate by dielectric coatings) in the solution process. One such simulator is Momentum 3D Planar EM simulator, available from Agilent Technologies, Inc., for example. Thus, according to various embodiments, the effect of a dielectric coating at the surface of a conductor is incorporated in the 3D planar EM modeling process. The dielectric coating modeling substantially extends the application range of the 3D planar EM simulator tools to include TSV connections, as well as other components having conductor surfaces covered by dielectric coatings, such as MIM capacitors, passivation layers, and the like.

Figure 2:
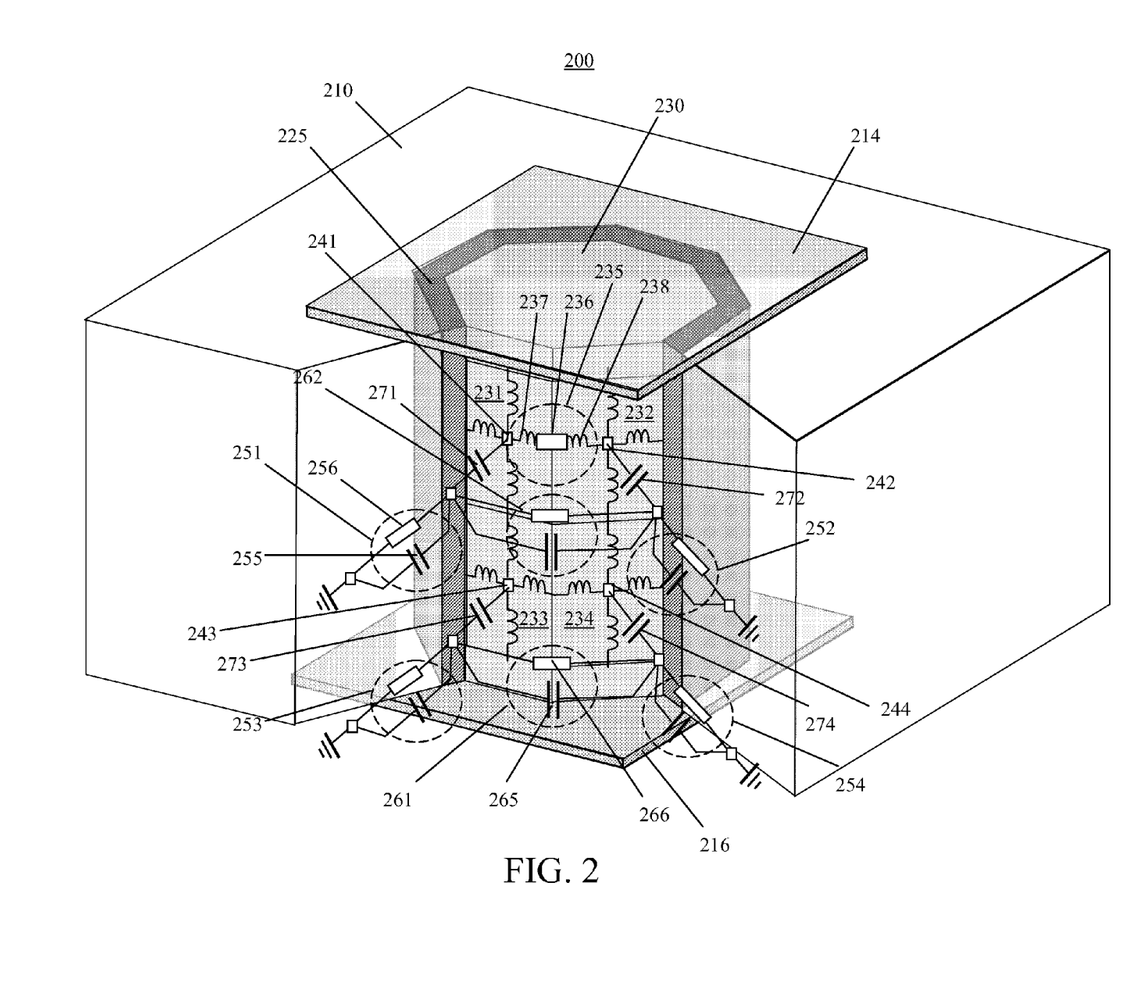
FIG. 2 is a three-dimensional circuit diagram showing modeling circuitry of a conductor and dielectric coating, according to a representative embodiment.

As discussed above, a 3D planar EM simulator reliant on the Green's function deploys meshing of a conductor surface to model the electric current distribution. FIG. 2 is a 3D circuit diagram showing modeling circuitry of a TSV and corresponding dielectric coating, according to a representative embodiment.

Referring to FIG. 2, die 200 includes substrate 210 with representative TSV 230 passing through the substrate 210. Similar to the configuration depicted in FIG. 1, the TSV 230 electrically connects bond pad 214 on the top surface of the substrate 210 and landing pad 216 on the bottom surface of the substrate 210. The TSV 230 is separated from the substrate 210 by TSV liner, referred to as dielectric coating 225, which is a thin layer of dielectric material. Surface meshing of the conductor (TSV 230) is performed in accordance with the Green's function technology, for example, resulting in the conductor surface being meshed into multiple conductor cells, indicated by representative conductor cells 231-234. As a result of the meshing operation, each conductor cell 231-234 has a corresponding node, indicated by nodes 241-244, respectively.

More particularly, according to standard method-of-moments technology, 3D planar EM interaction matrix [Z] resulting from conductor surface discretization of an electric field integral equation is decomposed out of a magnetic part, indicated by inductive impedance $[Z_L]$, and an electric part, indicated by capacitive impedance $[Z_C]$, connected together by discrete surface divergence operator [D], as indicated by Equation (1):

$$[Z]=[Z_L]+[D]^t[Z_C][D] \quad (1)$$

The decomposition corresponds with the magnetic and electric potential decomposition of the electric field, respectively. The inductive impedance $[Z_L]$ includes the resistive and inductive effects of the conductive current flowing in the conductor cells 231-234, and the capacitive impedance $[Z_C]$ includes the capacitive and conductive effects of the displacement current flowing from the conductor cells 231-234 to the surrounding substrate 210. The surface current discretization of the electric field integral equation yields a physical interpretation, e.g., depicted in FIG. 2. The discretized 3D planar EM interaction matrix indicated by Equation (1) is effectively equivalent to Kirchoff network equations of a distributed LC network with a topology that corresponds with the surface mesh.

As mentioned above, for each conductor cell 231-234 of the conductor surface mesh in the illustrative network topology depicted in FIG. 2, there is a corresponding node 241-244. The nodes 241-244 are connected to nodes in adjacent conductor cells 231-234 through (resistive/inductive) conductor branches for modeling the respective conductive currents in the conductor cells 231-234. For clarity, FIG. 2 shows only one representative conductor branch 235 connected between nodes 241 and 242, although it is understood that similar branches connect the other adjacent nodes 241-244. It is also understood that all the inductors (adjacent and non-adjacent) in the network are mutually coupled (not shown for clarity). The representative conductor branch 235 includes resistance 236 and first and second inductances 237 and 238 connected in series between nodes 241 and 242. In addition, the nodes 241 and 242 are connected to the bond pad 214 and the nodes 243 and 244 are connected to the landing pad 216 through corresponding conductor branches (not shown), which may be similar in composition to the representative conductor branch 235.

The nodes 241-244 are also connected to ground through corresponding (conductive/capacitive) first branches 251-254 (via coating capacitances 271-274, discussed below) for modeling respective first displacement currents flowing from the conductor cells 231-234 to the surrounding substrate 110. In addition, the nodes 241-244 are connected to one another by (conductive/capacitive) second branches (via coating capacitances 271-274, discussed below), indicated by representative second branches 261-262, also for modeling the respective first displacement currents flowing from the conductor cells 231-234 to the surrounding substrate 110. For clarity, FIG. 2 shows only two representative second branches 261-262 connected between nodes 243 and 244 and between nodes 241 and 242, respectively, although it is understood that similar second branches connect the other nodes 241-244 with one another, adjacent and non-adjacent.

Each of the first branches 251-254 include a first conductance connected in parallel with a first capacitance, as indicated by representative first conductance 256 and first capacitance 255 of representative first conductive/capacitive branch 251. Similarly, each of the second branches 261-262 include a second conductance connected in parallel with a second capacitance, as indicated by representative second conductance 266 and second capacitance 265 of representative second branch 261.

Notably, FIG. 2 depicts an embodiment in which the substrate 210 is formed of a semiconductor material. In alternative embodiments, the substrate 210 may be formed of a dielectric material, as opposed to a semiconductor material. For modeling in this case, each of the first branches connecting the nodes 241-244 to ground includes only a first capacitance (e.g., first capacitance 255, and no first conductance 256), and likewise each of the second branches connecting the nodes 241-244 to one another includes only a second capacitance (e.g., second capacitance 265, and no second conductance 266).

Further, in order to model respective second displacement currents flowing from the conductor cells 231-234 to the surrounding dielectric coating 225, additional coating capacitances 271-274 are connected in series the nodes 241-244 and the first branches 251-254, respectively. The cell-based network representation of the discretized EM matrix equations thus enables the electric effect of the dielectric coating 225 to be directly included in the modeling process.

Thus, according to various embodiments, for each of the conductor cells 231-234, the second displacement current that flows from the conductor cell 231-234 through the dielectric coating 225 is modeled by coating capacitances 271-274, indicated by coating capacitance $C_{coat}$, embedded in series with the capacitive impedance $Z_C$ for that conductor cell 231-234. Repeating this for all the conductor cells 231-234 yields a coating-enhanced 3D planar EM interaction matrix, indicated by Equation (2) as follows:

$$[Z] = [Z_L] + [D]^t \cdot \left(\frac{1}{j\omega}[C_{coat}]^{-1} + [Z_C]\right) \cdot [D] \quad (2)$$

The cell-based capacitance matrix $[C_{coat}]$ represents the displacement currents in the coating material of the dielectric coating 225. The capacitance matrix $[C_{coat}]$ is diagonal with non-zero elements for each of the coated conductor cells 231-234. The coating capacitance for each of the conductor cells 231-234 is given by Equation (3), as follows:

$$C_{coat} = \frac{\varepsilon_{coat}}{T_{coat}} S \quad (3)$$

Referring to Equation (3), $\varepsilon_{coat}$ is the permittivity of the dielectric coating 225, $T_{coat}$ is the thickness of the dielectric coating 225, and S is the surface area of the corresponding conductor cell 231-234. Notably, including the effect of the dielectric coating 225 in the 3D planar EM interaction matrix is a straight-forward extension. It provides the flexibility of a mesh-based solution without additional unknowns. Therefore, the modeling of conductors (e.g., TSV 230) with a dielectric coating (e.g., dielectric coating 225) according to the various embodiments does not require additional computation resources.

In an embodiment, permittivity of the background material (e.g., the material of the substrate 110) may be included in the 3D planar EM modeling process. Since capacitance of the background material (replaced by the dielectric coating) is already taken into account by the Green's function interactions between the conductor cells 231-234, each of the coating capacitances 271-274 of the dielectric coating 225 may be corrected using negative background capacitance $C_{bg}$ (not shown in FIG. 2), connected in series, to obtain the excess coating capacitance. The inclusion of the background capacitance $C_{bg}$ is indicated, for example, by Equations (4a)-(4c), where Equation (4c) is obtained from Equations (4a) and (4b):

$$C_{bg} = \frac{\varepsilon_{bg}}{T_{coat}} S \quad (4a)$$

$$C_{coat} \leftarrow -\frac{C_{coat} C_{bg}}{C_{coat} - C_{bg}} \quad (4c)$$

$$C_{coat} = \frac{\varepsilon_{bg} \varepsilon_{coat}}{(\varepsilon_{bg} - \varepsilon_{coat})} \frac{S}{T_{coat}} \quad (4c)$$

Notably, when the material of the dielectric coating 225 is the same material as the background material, the excess coating capacitance becomes infinite and the cell based coating impedance matrix becomes zero. That is, nothing changes in the matrix equation.

Also, in an embodiment, conductivity of the background material may be included, as well. When the background material is a doped semiconductor, for example, the conductivity of the background material should be taken into account, which may be accomplished by replacing permittivity of the background mater $\varepsilon_{bg}$ with a complex permittivity, as shown in Equation (5a).

$$\varepsilon_{bg} \leftarrow \varepsilon_{bg} + \frac{\sigma_{bg}}{j\omega} \quad (5a)$$

Using the complex permittivity, a frequency dependent complex coating capacitance $C_{coat}(\omega)$ compensating for the complex permittivity may be obtained, indicated by Equation (5b), which may be simplified for low frequencies (in the limit of the frequency going to zero), as indicated by Equation 5(c), below:

$$C_{coat}(\omega) = \frac{\varepsilon_{coat}(j\omega\varepsilon_{bg} + \sigma_{bg})}{\sigma_{bg} + j\omega(\varepsilon_{bg} - \varepsilon_{coat})} \frac{S}{T_{coat}} \quad (5b)$$

$$C_{coat}(\omega \to 0) \approx \varepsilon_{coat} \frac{S}{T_{coat}} \quad (5c)$$

In addition, according to an embodiment, MOS depletion effect may be included in the 3D planar EM interaction matrix by determining a depletion layer capacitance. Again, when the substrate 210 is formed of a doped semiconductor material, for example, and the coated conductor (e.g., TSV 230 with dielectric coating 225) is in contact with the doped semiconductor material, the effect of a MOS depletion layer formed at the surface of the semiconductor material may be added to the model. In depletion mode, the major carriers in the semiconductor material are depleted, and the resulting depletion layer has a corresponding capacitance that modifies the cell capacitance of each of the conductor cells 231-234. The depletion layer capacitance depends on a voltage difference between the bulk voltage of the conductor (e.g., TSV 230) and a bulk voltage of the substrate (e.g., substrate 210).

The total cell capacitance for each of the conductor cells 231-234 is therefore the series combination of the coating capacitance $C_{coat}$ and the voltage dependent depletion layer capacitance $C_d(V)$, as indicated by Equation (6a):

$$C_{tot} = \frac{C_{coat} C_d(V)}{C_{coat} + C_d(V)} \quad (6a)$$

Accordingly, the combined MOS depletion and coating-enhanced 3D planar EM interaction matrix may be obtained, as indicated by Equation (6b):

$$[Z] = [Z_L] + [D]^t \cdot \left(\frac{1}{j\omega}[C_{coat}]^{-1} + \frac{1}{j\omega}[C_d(V)]^{-1} + [Z_C]\right) \cdot [D] \quad (6b)$$

An analytical expression for the depletion layer capacitance $C_d(V)$ follows from the theory of the MOS capacitor, as discussed, for example by S. M. Sze, PHYSICS OF SEMICONDUCTOR DEVICES, John Wiley & Sons ($2^{nd}$ ed.), ISBN 0-471-05661-8, p. 369 (1981), which is hereby incorporated by reference. The analytical expression for the depletion layer capacitance $C_d(V)$ is indicated by Equation (6c), below:

$$C_d(V) = \frac{\varepsilon_s}{T_d(V)} S \quad (6c)$$

The depletion layer thickness $T_d(V)$ depends upon the conductor (TSV) bulk voltage. Again, provided that all material parameters are known and the conductor bulk voltage is given or determined, as discussed below, including the effect of a semiconductor depletion layer in the electromagnetic interaction matrix is straight-forward and requires no additional unknowns.

Figure 3:
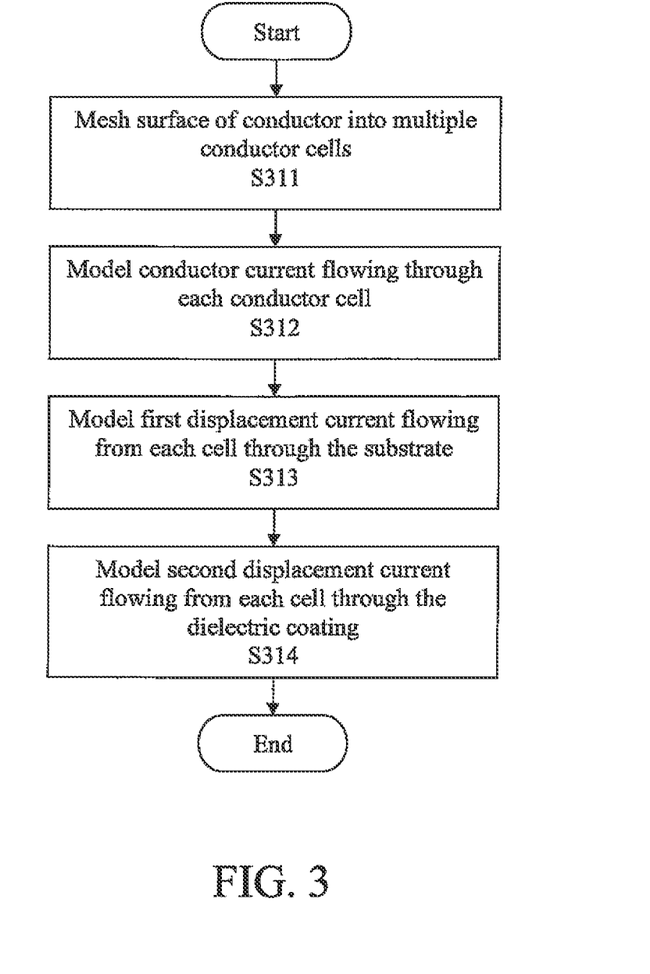
FIG. 3 is a flowchart illustrating a method of modeling a conductor and dielectric coating, according to a representative embodiment.

FIG. 3 is a flowchart illustrating a method of modeling a conductor and dielectric coating, according to a representative embodiment. The method may be implemented in whole or in part by a processor, such as processor 421 in representative computer system 415, described below with reference to FIG. 4. In various alternative embodiments, the method may be implemented by a processor, application specific integrated circuits (ASICs), field-programmable gate arrays (FPGAs), or combinations thereof, using software, firmware, hard-wired logic circuits, or combinations thereof. When using a processor, a memory is included for storing executable software/firmware and/or executable code that allows it to perform the various functions.

Referring to FIG. 3, a surface of the conductor (e.g., TSV 230 of FIG. 2) passing through a substrate (e.g., substrate 210) is meshed into multiple conductor cells (e.g., conductor cell 231-234) in block S311. The meshing may be performed according to any surface meshing techniques, including surface meshing performed in conjunction with the Green's function technology, for example. As a result of the meshing process, each conductor cell has a corresponding node (e.g., nodes 241-244).

In block S312, a conductive current flowing through each conductor cell is modeled. Modeling the conductive current includes connecting the node corresponding to each conductor cell to another node corresponding to each adjacent conductor cell through a conductor branch. For example, as shown in FIG. 2, node 241 of conductor cell 231 is connected to node 242 of conductor cell 232 via representative resistive/inductive conductor branch 235, which includes resistor 236 and first and second inductances 237 and 238 connected in series. Although not specifically labeled in FIG. 2 for purpose of clarity, it is understood that the node 241 is also connected to other adjacent nodes, as well as the bond pad 214, through conductor branches like representative conductor branch 235, in order to fully model the conductive current.

A first displacement current flowing from each conductor cell through the substrate is modeled in block S313. As discussed above, modeling the first displacement current includes connecting each of the nodes corresponding to the conductor cells to ground through a first branch (e.g., conductive/capacitive first branches 251-254). Modeling the first displacement current may further include connecting each of the nodes to nodes associated with the other conductor cells through corresponding second branches (e.g., conductive/capacitive second branches 261-262).

In the embodiment depicted in FIG. 2, the substrate 210 is assumed to be a semiconductor substrate, formed of silicon or doped silicon, for example. In this case, the first branch includes a first capacitance connected in parallel with a first conductance (e.g., first capacitance 255 connected in parallel with first conductance 256 of illustrative first branch 251), and the second branch includes a second capacitance connected in parallel with a second conductance (e.g., second capacitance 265 connected in parallel with second conductance 266 of illustrative second branch 261), as discussed above. Alternatively, when the substrate 210 is formed of a dielectric material, such as silicon dioxide, there is no need for a conductance to be included in the respective first and second branches. For example, the first branch may include only the first capacitance (e.g., first capacitance 255 of illustrative first branch 251 with no first conductance 256), and the second branch may include only the second capacitance (e.g., second capacitance 265 of illustrative second branch 261 with no second conductance 266).

In block S314 of FIG. 3, a second displacement current flowing from each conductor cell through the dielectric coating is modeled. As discussed above, modeling the second displacement current includes determining a coating capacitance connected in series between each node and the corresponding first branch, where the coating capacitance represents the capacitive effect of the dielectric layer. For example, referring to FIG. 2, nodes 241-244 are connected in series to corresponding first branches 251-254 via coating capacitances 271-274, respectively.

Figure 4:
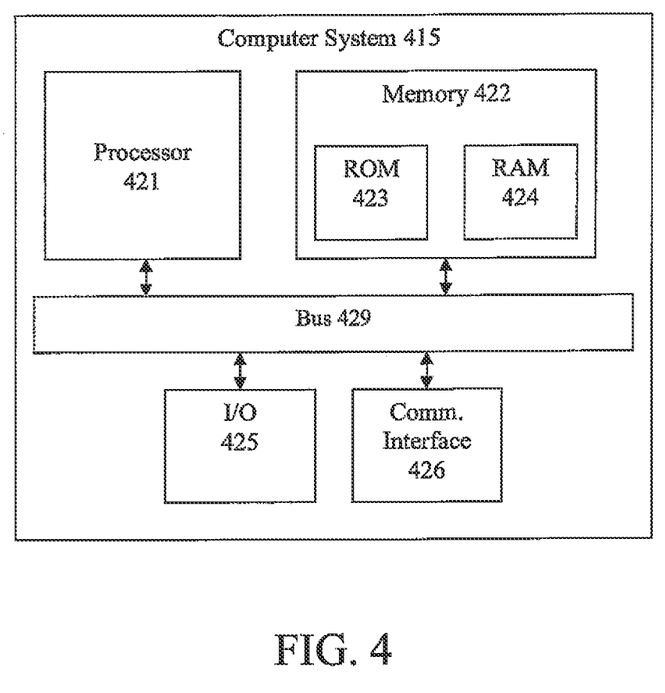
FIG. 4 is a functional block diagram showing an illustrative computer system for implementing conductor and dielectric coating models, according to a representative embodiment.

As stated above, processes for modeling a conductor (e.g., TSV) and dielectric coating may be completely or partially automated, e.g., using a computer system. FIG. 4 is a functional block diagram showing an illustrative computer system 415 that executes all or a portion of a process for implementing a dielectric coating model, according to a representative embodiment. The various "parts" shown in the computer system 415 may be physically implemented using a software-controlled microprocessor, e.g., processor 421, hard-wired logic circuits, firmware, or a combination thereof. Also, while the parts are functionally segregated in the computer system 415 for explanation purposes, they may be combined variously in any physical implementation.

In the depicted embodiment, the computer system 415 includes processor 421, memory 422, bus 429 and various interfaces 425-426. The processor 421 is configured to execute one or more logical or mathematical algorithms, including the conductor and dielectric coating modeling process of the embodiments described herein (e.g., including the various steps of FIG. 3), in conjunction with the memory 422. The processor 421 may be constructed of any combination of hardware, firmware or software architectures, and include its own memory (e.g., nonvolatile memory) for storing executable software/firmware executable code that allows it to perform the various functions. Alternatively, the executable code may be stored in designated memory locations within memory 422, discussed below. In an embodiment, the processor 421 may be a central processing unit (CPU), for example, executing an operating system, which may also control execution of other programs of the computer system 415.

The memory 422 may be any number, type and combination of nonvolatile read only memory (ROM) 423 and volatile random access memory (RAM) 424, and stores various types of information, such as computer programs and software algorithms executable by the processor 421 (and/or other components), e.g., to perform location determination processes of the embodiments described herein. As generally indicated by ROM 423 and RAM 424, the memory 422 may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like. Further, the memory 422 may store the predetermined boundaries one or more enterprise networks, as discussed above.

Further, data or other information may be received from various other components through communication or network interface 426, and communicated to the processor 421 and/or the memory 422 via bus 429. The type, number and arrangement of the network interfaces may vary. In an embodiment, a user and/or other computers may interact with the computer system 415 using various input device(s)

through I/O interface 425. The input devices may include a keyboard, key pad, a track ball, a mouse, a touch pad or touch-sensitive display, and the like. Also, various information may be displayed on a display through a display interface (not shown), which may include any type of graphical user interface (GUI).

In an embodiment, the conductor and dielectric coating modeling process may be implemented by editing existing 3D planar EM simulator software, e.g., that relies on the Green's function technology and conductor surface meshing. For example, using Agilent Momentum software, dielectric coating may be added to conductor cells by editing the mesh data file and enabling the coating layer technology in the Momentum simulation engine with a configuration variable. An example of mesh file syntax may be as follows:

```
beg_Xinfo :
    [beg_layer <name> :
        [Type : (metal|via|slot);]
        [Level: <substrateLevel>;]
        [Plane: z = (<value>|[value1,value2]);]
        ...
        [Coating:
            thickness <value> [<unit>]
            permittivity <epsr>
            [depletion (ntype|ptype) <voltage> ]
        ;]
        ...
    end_layer <name>;]...
end_Xinfo ; ....
```

In this implementation, the TSV conductor-silicon bulk voltage difference needed to compute the depletion layer capacitance is provided by the user as an input parameter.

In another implementation, a device for modeling a semiconductor circuit includes a DC circuit simulator, along with a planar EM simulator linked to the DC circuit simulator. The semiconductor circuit includes a substrate, a dielectric layer and a conductor embedded in the dielectric layer, as shown for example by the modeling circuitry of FIG. 2. The DC circuit simulator is used prior to the planar EM simulator to determine or otherwise compute all DC voltages in the semiconductor circuit. In an embodiment including a TSV conductor, for example, the TSV conductor-silicon bulk voltage difference needed to determine the depletion layer capacitance may therefore be automatically derived from the DC circuit simulation results. Thus, DC circuit simulation may be used to automatically obtain the voltage difference needed to determine the depletion layer capacitance. Likewise, the TSV conductor and a dielectric coating formed between the TSV conductor and the substrate may be modeled, as discussed above.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A method for modeling a conductor in a substrate and a dielectric coating formed between the conductor and the substrate, the method comprising:
    meshing a surface of the conductor into a plurality of conductor cells, each conductor cell including a corresponding node in network topology;
    modeling a first displacement current flowing from each conductor cell through the substrate using a computer processor, wherein modeling the first displacement current comprises determining a first branch connecting the node corresponding to each conductor cell to ground, the first branch having at least a first capacitance; and
    modeling a second displacement current flowing from each conductor cell through the dielectric coating using a computer processor, wherein modeling the second displacement current comprises determining a coating capacitance connected in series between the node corresponding to each conductor cell and the first branch, the coating capacitance representing a capacitive effect of the dielectric coating,
    wherein modeling the first displacement current further comprises determining a second branch connecting the coating capacitance corresponding to each conductor cell to another coating capacitance corresponding to another conductor cell, the second branch having at least a second capacitance.

2. The method of claim 1, wherein the substrate comprises a semiconductor substrate.

3. The method of claim 2, wherein the first branch comprises the first capacitance connected in parallel with a first conductance, and the second branch comprises the second capacitance connected in parallel with a second conductance.

4. The method of claim 2, wherein modeling the second displacement current further comprises determining a depletion layer capacitance of a depletion layer, formed at a surface of the substrate with respect to each cell resulting from a metal-oxide-semiconductor (MOS) depletion effect, and wherein determining the coating capacitance includes compensating for the depletion layer capacitance for the cell.

5. The method of claim 4, wherein determining the depletion layer capacitance of the depletion layer comprises:
    determining a voltage of the conductor; and
    determining a voltage of the semiconductor substrate; and
    determining a voltage difference between the conductor and the semiconductor substrate, wherein the depletion layer capacitance depends on the determined voltage difference.

6. The method of claim 5, wherein the voltage of the conductor and the voltage of the semiconductor substrate are determined by a DC circuit simulator.

7. The method of claim 1, wherein the substrate comprises a dielectric substrate.

8. The method of claim 7, wherein the first branch comprises the first capacitance and no conductance, and the second branch comprises the second capacitance and no conductance.

9. The method of claim 1, further comprising:
    modeling a current flowing through each conductor cell, wherein modeling the current comprises connecting the node corresponding to each conductor cell to another node corresponding to an adjacent conductor cell through a conductor branch, comprising a resistance and an inductance connected in series.

10. The method of claim 1, wherein the conductor in the substrate is a conductive interconnection comprising a through-silicon via (TSV).

11. The method of claim 10, wherein the TSV comprises at least one of polysilicon, copper and tungsten.

12. The method of claim 11, wherein the dielectric coating comprises silicon dioxide, and provides isolation between the TSV and the substrate.

13. A method for modeling a conductor in a substrate and a dielectric coating formed between the conductor and the substrate, the method comprising:

meshing a surface of the conductor into a plurality of conductor cells, each conductor cell including a corresponding node in network topology;

modeling a first displacement current flowing from each conductor cell through the substrate using a computer processor, wherein modeling the first displacement current comprises determining a first branch connecting the node corresponding to each conductor cell to ground, the first branch having at least a first capacitance; and modeling a second displacement current flowing from each conductor cell through the dielectric coating using a computer processor, wherein modeling the second displacement current comprises determining a coating capacitance connected in series between the node corresponding to each conductor cell and the first branch, the coating capacitance representing a capacitive effect of the dielectric coating, wherein modeling the second displacement current further comprises determining a background capacitance of a portion of the substrate replaced by the dielectric coating for each conductor cell, and wherein determining the coating capacitance includes correcting for the background capacitance determined for the conductor cell.

14. The method of claim 13, wherein modeling the second displacement current further comprises determining complex permittivity of a portion of the substrate replaced by the dielectric coating for each conductor cell, and wherein determining the coating capacitance includes compensating for the complex permittivity determined for the conductor cell.

15. A device for modeling a semiconductor circuit comprising a semiconductor substrate, a dielectric layer and a conductor embedded in the dielectric layer, the device comprising:

a computer processor implementing a planar electromagnetic modeling (EM) simulator configured to model electromagnetic effects of the conductor automatically, wherein the modeling comprises meshing a surface of the conductor into a plurality of conductor cells; modeling a first displacement current flowing from each conductor cell through the substrate, including determining a first branch connecting a node corresponding to each conductor cell to ground; and modeling a second displacement current flowing from each conductor cell through the dielectric layer, including determining a capacitance connected in series between the node corresponding to each conductor cell and the first branch, wherein the capacitance represents a capacitive effect of the dielectric layer, and wherein modeling the first displacement current further includes determining a second branch connecting a coating capacitance corresponding to each conductor cell to another coating capacitance corresponding to another conductor cell, the second branch having at least a second capacitance.

16. The device of claim 15, further comprising:

a DC circuit simulator configured to determine a plurality of DC voltages in the semiconductor circuit.

17. The device of claim 16, wherein the DC circuit simulator determines the plurality of DC voltages by determining a voltage of the conductor and determining a voltage of the semiconductor substrate; and wherein the difference between the plurality of DC voltages comprises the difference between the conductor voltage and the semiconductor voltage, which is used to determine a depletion layer capacitance of a depletion layer.

18. The device of claim 17, wherein the depletion layer is formed at a surface of the semiconductor substrate, resulting from a metal-oxide-semiconductor (MOS) depletion effect.

* * * * *